(12) United States Patent
Chen

(10) Patent No.: US 7,586,359 B2
(45) Date of Patent: Sep. 8, 2009

(54) SIGNAL COUPLING CIRCUIT AND METHOD

(75) Inventor: Chien-Hung Chen, ChuPei (TW)

(73) Assignee: Mstar Semiconductor, Inc., Hsinchu Hsien (TW)

( * ) Notice: Subject to any disclaimer, the term of this patent is extended or adjusted under 35 U.S.C. 154(b) by 153 days.

(21) Appl. No.: 11/493,515

(22) Filed: Jul. 27, 2006

(65) Prior Publication Data

US 2007/0257726 A1 Nov. 8, 2007

(30) Foreign Application Priority Data

May 2, 2006 (TW) ............... 95115652 A

(51) Int. Cl.
*H03K 17/00* (2006.01)
(52) U.S. Cl. ................... 327/407; 327/99
(58) Field of Classification Search ............... 327/407, 327/408, 309, 545, 99, 337
See application file for complete search history.

(56) References Cited

U.S. PATENT DOCUMENTS 5,568,070 A * 10/1996 Osaki et al. ............... 326/113
6,040,718 A * 3/2000 Henry ........................ 327/71
6,486,712 B1 * 11/2002 Landry et al. .............. 327/99
6,794,921 B2 * 9/2004 Abe et al. ................... 327/309
6,845,048 B2 * 1/2005 Alexander et al. ...... 365/189.02
7,084,695 B2 * 8/2006 Porter ........................ 327/512
7,315,200 B2 * 1/2008 Holberg et al. ............. 327/554
2005/0168370 A1 8/2005 Mokhtari et al.
2006/0044047 A1 3/2006 Porter

FOREIGN PATENT DOCUMENTS

TW 215134 10/1993
TW 456143 9/2001

* cited by examiner

*Primary Examiner*—Lincoln Donovan
*Assistant Examiner*—Hai L Nguyen
(74) *Attorney, Agent, or Firm*—Bacon & Thomas, PLLC

(57) ABSTRACT

The invention provides a signal coupling circuit and method for coupling an analog input signal to a processing circuit. The signal coupling circuit includes a number of first coupling units, a second coupling unit and a first multiplexer. The first coupling units are coupled to a first input terminal of the processing circuit, for respectively receiving a plurality of input signals. The first multiplexer is coupled between the first coupling units and the processing circuit for selecting one of the input signals and transmitting the selected input signal to the processing circuit. The second coupling unit is coupled to a second input terminal of the processing circuit, for receiving a common reference signal, wherein the processing circuit uses the common reference signal as reference for processing some or all of the input signals.

12 Claims, 9 Drawing Sheets

SIGNAL COUPLING CIRCUIT AND METHOD

This application claims the benefit of Taiwan application Serial No. 95115652, filed May 2, 2006, the subject matter of which is incorporated herein by reference.

BACKGROUND OF THE INVENTION

1. Field of the Invention

The invention relates in general to a signal coupling method and circuit, and more particularly to a signal coupling method and circuit using a common reference input.

2. Description of the Related Art

When an integrated circuit (IC) device processes a signal, owing that the voltage required inside the device is different from the voltage used outside the device, the ac component of the signal is usually coupled into the device in a capacitor coupling way and then the required voltage level of the signal is given according to various application conditions. If a reference signal of the signal can also be coupled into the device when the signal is being coupled into the device, the device can have better noise-resistance effect. Referring to FIG. 1, a schematic diagram of a conventional signal coupling circuit is shown. The IC device 100 includes a processing circuit 115. The processing circuit 115 has a positive input terminal for receiving input signals and a negative input terminal for receiving reference signals of the input signals. The input signals sig_A, sig_B, and sig_C are respectively coupled to the IC device 100 via the capacitors 121, 122, and 123. The IC device 100 further includes a multiplexer (MUX) 130 connected between the capacitors 121, 122 and 123, and the processing circuit 115 for selectively outputting one of the three signals sig_A, sig_B, and sig_C to the processing circuit 115. Similarly, the reference signals ref_A, ref_B, and ref_C corresponding to the signals sig_A, sig_B, and sig_C are respectively coupled to the IC device via the capacitors 124, 125, and 126, and a multiplexer 131 connected between the capacitors 124, 125 and 126, and the processing circuit 115 is used for selectively outputting one of the three reference signals ref_A, ref_B, and ref_C to the processing circuit 115.

For example, when the processing circuit 115 is to process the signal sig_B, the multiplexer 130 selects to output the signal sig_B to the positive input terminal of the processing circuit 115 in the meanwhile the multiplexer 131 selects to output the reference signal ref_B of the signal sig_B to the negative terminal of the processing circuit 115. However, when the number of the input signals is increased, the number of the corresponding reference signals will be increased accordingly. As a result, the IC device 100 needs to have more pins for signals and the circuit board needs more coupling capacitors, thereby increasing circuit cost.

SUMMARY OF THE INVENTION

It is therefore an object of the invention to provide a signal coupling circuit and method in which a common reference signal is used to achieve the purpose of reducing the number of device pins and coupling capacitors.

The invention achieves the above-identified object by providing a signal coupling circuit, for coupling an analog input signal to a processing circuit. The signal coupling circuit includes a number of first coupling units, a second coupling unit and a first multiplexer. The first multiplexer is coupled between the first coupling units and the processing circuit for selecting one of the input signals and transmitting the selected input signal to the processing circuit. The first coupling units are coupled to a first input terminal of the processing circuit, for respectively receiving a plurality of input signals. The second coupling unit is coupled to a second input terminal of the processing circuit, for receiving a common reference signal, wherein the processing circuit uses the common reference signal as reference for processing some or all of the input signals.

The invention achieves the above-identified object by providing another signal coupling circuit, for coupling an analog input signal to a first processing circuit and a second processing circuit. The signal coupling circuit includes at least a first coupling unit, at least a second coupling unit and a third coupling unit. The first coupling unit is coupled to a first input terminal of the first processing circuit for receiving at least a first input signal. The second coupling unit is coupled to a first input terminal of the second processing circuit for receiving at least a second input signal. The third coupling unit is coupled to a second input terminal of the first processing circuit and a second input terminal of the second processing circuit for receiving a common reference signal. The first processing circuit and the second processing circuit use the common reference signal as reference for respectively processing the first input signal and the second input signal.

The invention achieves the above-identified object by providing a method for coupling an analog input signal to a processing circuit, including utilizing a plurality of first coupling units to respectively receive different input signals; coupling the input signals to a first input terminal of the processing circuit; utilizing a second coupling unit to receive a reference signal; and coupling the reference signal to a second input terminal of the processing circuit, wherein the processing circuit uses the reference signal as reference for processing some or all of the input signals.

The invention achieves the above-identified object by providing another method for coupling an analog input signal to a first processing circuit and a second processing circuit, including receiving at least a first input signal via at least a first coupling unit, and coupling the input signal to a first input terminal of the first processing circuit; receiving at least a second input signal via at least a second coupling unit, and coupling the second input signal to a first input terminal of the second processing circuit; and receiving a reference signal via a third coupling unit, and coupling the reference signal to a second input terminal of the first processing circuit and a second input terminal of the second processing circuit; wherein the first processing circuit and the second processing circuit use the reference signal as reference for respectively processing the first input signal and the second input signal.

Other objects, features, and advantages of the invention will become apparent from the following detailed description of the preferred but non-limiting embodiments. The following description is made with reference to the accompanying drawings.

DETAILED DESCRIPTION OF THE INVENTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . .". Also, the term "couple" is intended to mean either an indirect or direct electrical connection. Accordingly, if one device is coupled to another device, that connection may be through a direct electrical connection, or through an indirect electrical connection via other devices and connections.

Figure 1:
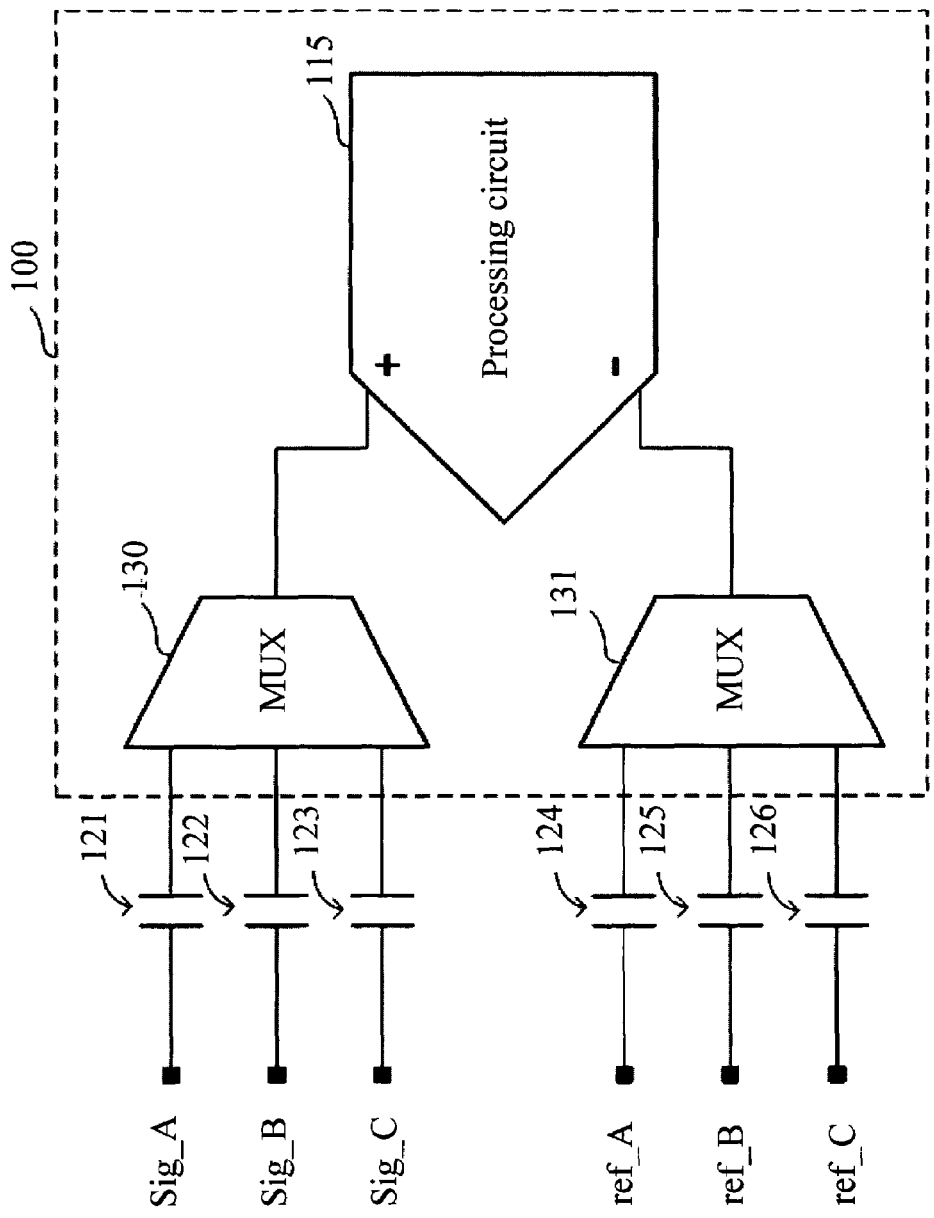
FIG. 1 is a schematic diagram of a conventional signal coupling circuit.
Figure 2:
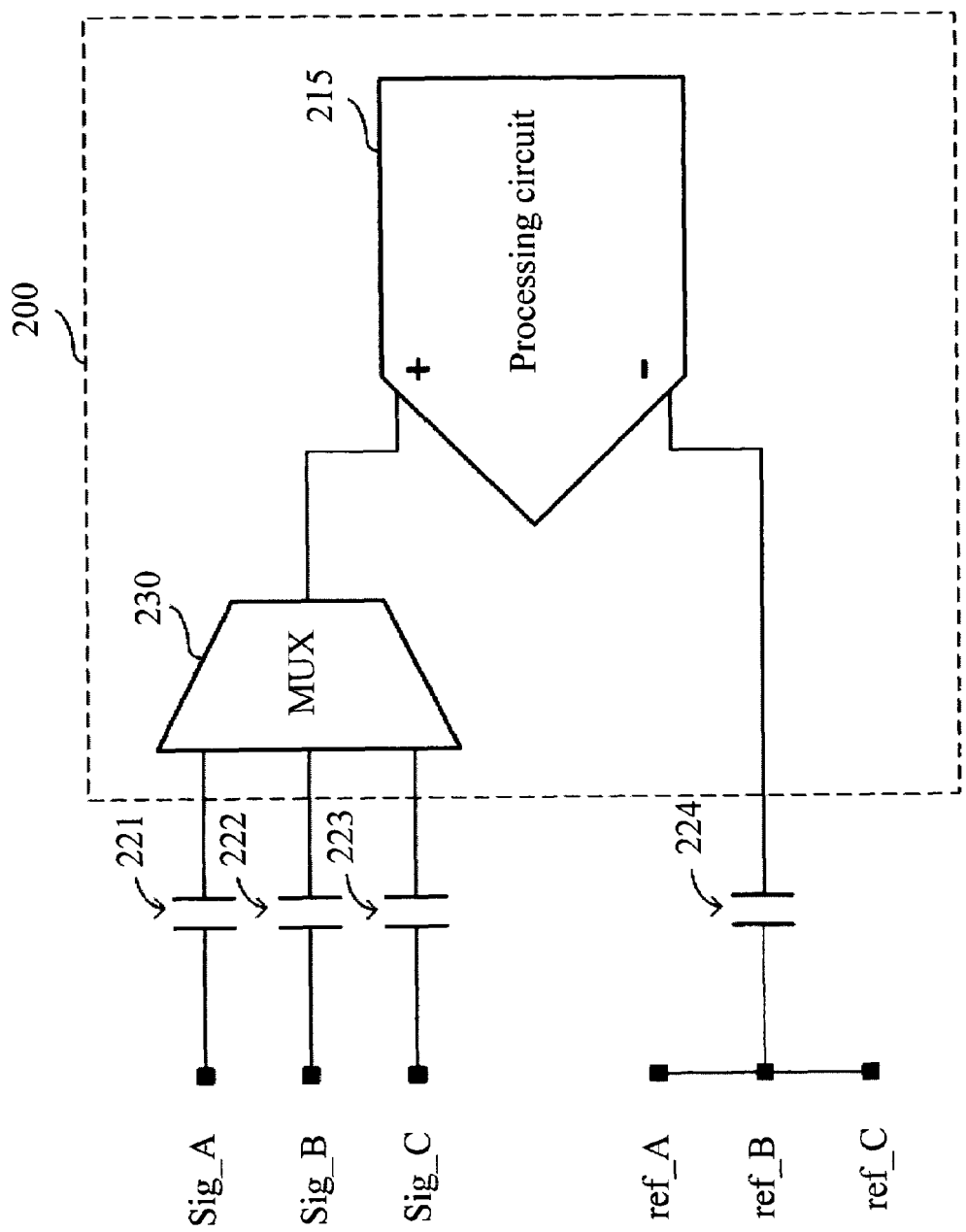
FIG. 2 is a schematic diagram of a coupling circuit according to a first embodiment of the invention.

Referring to FIG. 2, a schematic diagram of a coupling circuit according to a first embodiment of the invention is shown. A processing circuit 215 of the IC device 200 has an input terminal, such as a positive input terminal, for receiving input signals sig_A, sig_B, and sig_C, and another input terminal, such as a negative input terminal, for receiving reference signals ref_A, reg_B, and ref_C. The signals ref_A, reg_B, and ref_C are respectively reference signals of the input signals sig_A, sig_B, and sig_C. Generally, most of the signals on a circuit board use a common reference point, such as a ground point, as the reference signal. Therefore, any one of the signals ref_A, reg_B, and ref_C can be used as a common reference signal for the input signals sig_A, sig_B, and sig_C. The input signals sig_A, sig_B, and sig_C are usually analog signals and the processing circuit 215 is a circuit for processing the input signals sig_A, sig_B, and sig_C. For example, the processing circuit 215 can be a filter, an analog-to-digital converter (ADC), an amplifier or a signal buffer. As shown in FIG. 2, the three reference signals ref_A, reg_B, and ref_C are inputted to the negative input terminal of the processing circuit 215 via a common coupling unit 224. On the other hand, the input signals sig_A, sig_B, and sig_C are inputted to the positive input terminal of the processing circuit 215 respectively via the coupling units 221, 222 and 223. The processing circuit 215 uses the reference signal ref_A, reg_B, or ref_C received by the coupling uint 224 as reference for processing the signals sig_A, sig_B, and sig_C commonly. That is, the processing circuit 215 uses a common reference signal as reference for processing all the input signals according to. As mentioned above, if the three reference signals ref_A, reg_B, or ref_C refer to a common reference point, such as a ground point, the coupling unit 224 can receive just one (such as ref_B) of the three reference signals ref_A, reg_B, and ref_C, and couple the received reference signal (ref_B) to the processing circuit 215. In this embodiment, the coupling units 221, 222, 223 and 224 are implemented by capacitors, and the processing circuit 215 can optionally include a clamp circuit for adjusting dc voltage levels of the input signals sig_A, sig_B, and sig_C and reference signals ref_A, reg_B, and ref_C. In addition, the IC device 200 further includes a multiplexer (MUX) 230 coupled between the coupling units 221, 222 and 223 and the processing circuit 215. The coupling units 221, 222 and 223 respectively couple the input signals sig_A, sig_B, and sig_C to the multiplexer 230, and the multiplexer 230 takes charge of selecting one of the input signals sig_A, sig_B, and sig_C and outputting the selected input signal to the processing circuit 215 for further processing. In this embodiment, the input signals sig_A, sig_B, and sig_C are transmitted to the IC device 200 via their corresponding coupling units, but their reference signals ref_A, reg_B, and ref_C form a common reference signal and the common reference signal is inputted to the IC device 200 via the coupling unit 224. Therefore, not only the pin number of the IC device 200 can be reduced but also the number of the coupling units disposed on the circuit board can be reduced to reduce circuit cost.

Figure 3:
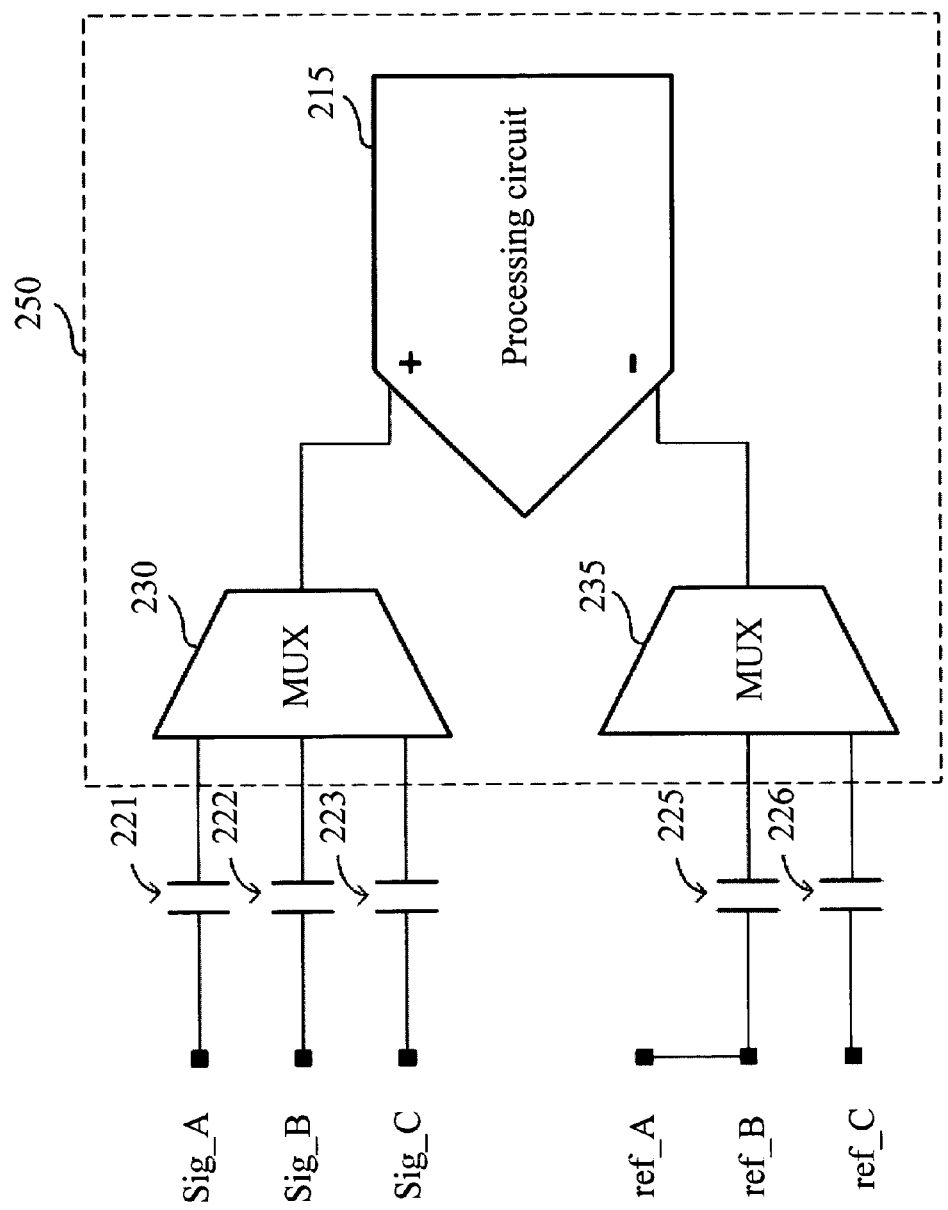
FIG. 3 is a schematic diagram of a coupling circuit according to a second embodiment of the invention.

Referring to FIG. 3, a schematic diagram of a coupling circuit according to a second embodiment of the invention is shown. In the embodiment, the negative input terminal of the processing circuit 215 is coupled to two coupling units 225 and 226. The coupling unit 225 receives some of the reference signals ref_A, ref_B, and ref_C, such as the reference signals ref_A and ref_B. The other coupling unit 226 receives the remaining reference signals, i.e. ref_C in the embodiment. The reference signals ref_A and ref_B form a common reference signal. The IC device 250 includes a multiplexer 235 in addition to the processing circuit 215 and the multiplexer 230. The multiplexer 235 selectively outputs the common reference signals ref_A and ref_B received by the coupling unit 225 or the reference signal ref_C received by the coupling unit 226 to the processing circuit 215 for further processing. More specifically, the processing circuit 215 uses the common reference signals ref_A and ref_B as reference for processing some of the input signals, that is, sig_A and sig_B, and uses the reference signal ref_C as reference for processing the input signal sig_C. In one preferred embodiment, the multiplexers 230 and 235 can be implemented by the same multiplexer. In this embodiment, the coupling units 225 and 226 are implemented by capacitors, and other devices having the same symbols as those depicted in the first embodiment have the same function and operation principle.

Figure 4:
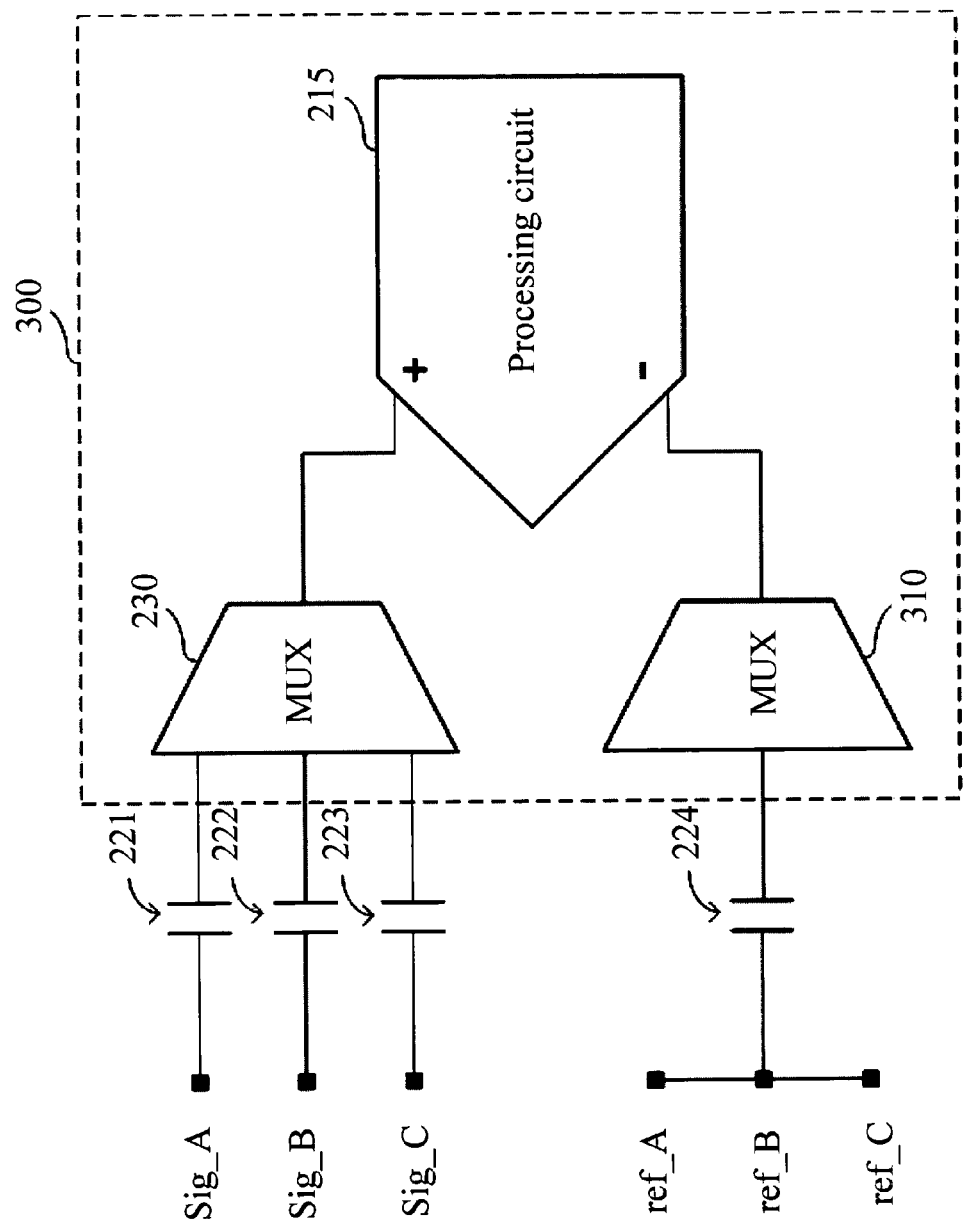
FIG. 4 is a schematic diagram of a coupling circuit according to a third embodiment of the invention.

Referring to FIG. 4, a schematic diagram of a coupling circuit according to a third embodiment of the invention is shown. In this embodiment, in addition that the IC device 300 includes a multiplexer 310, the operation principle of the rest circuit in the IC device 300 is the same as that of the IC device 100 in the first embodiment. The multiplexer 310 is coupled between the coupling unit 224 and the processing circuit 215 for providing circuit symmetry and thus the input impedance of the input signals sig_A, sig_B and sig_C can be closer to the input impedance of the reference signals ref_A, ref_B, and ref_C. In one preferred embodiment, the multiplexers 230 and 310 are implemented by the same multiplexer.

Figure 5:
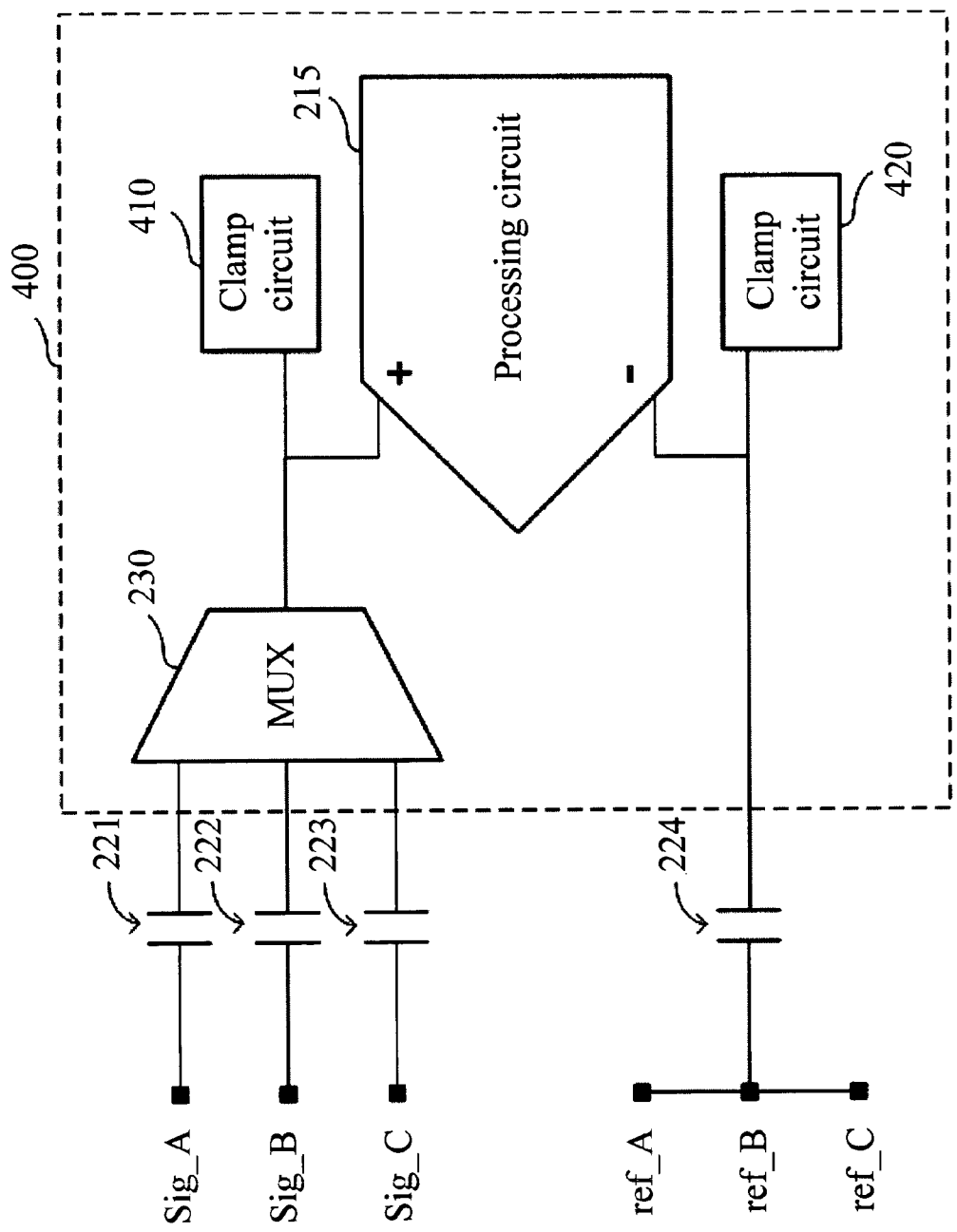
FIG. 5 is a schematic diagram of a coupling circuit according to a fourth embodiment of the invention.
Figure 6:
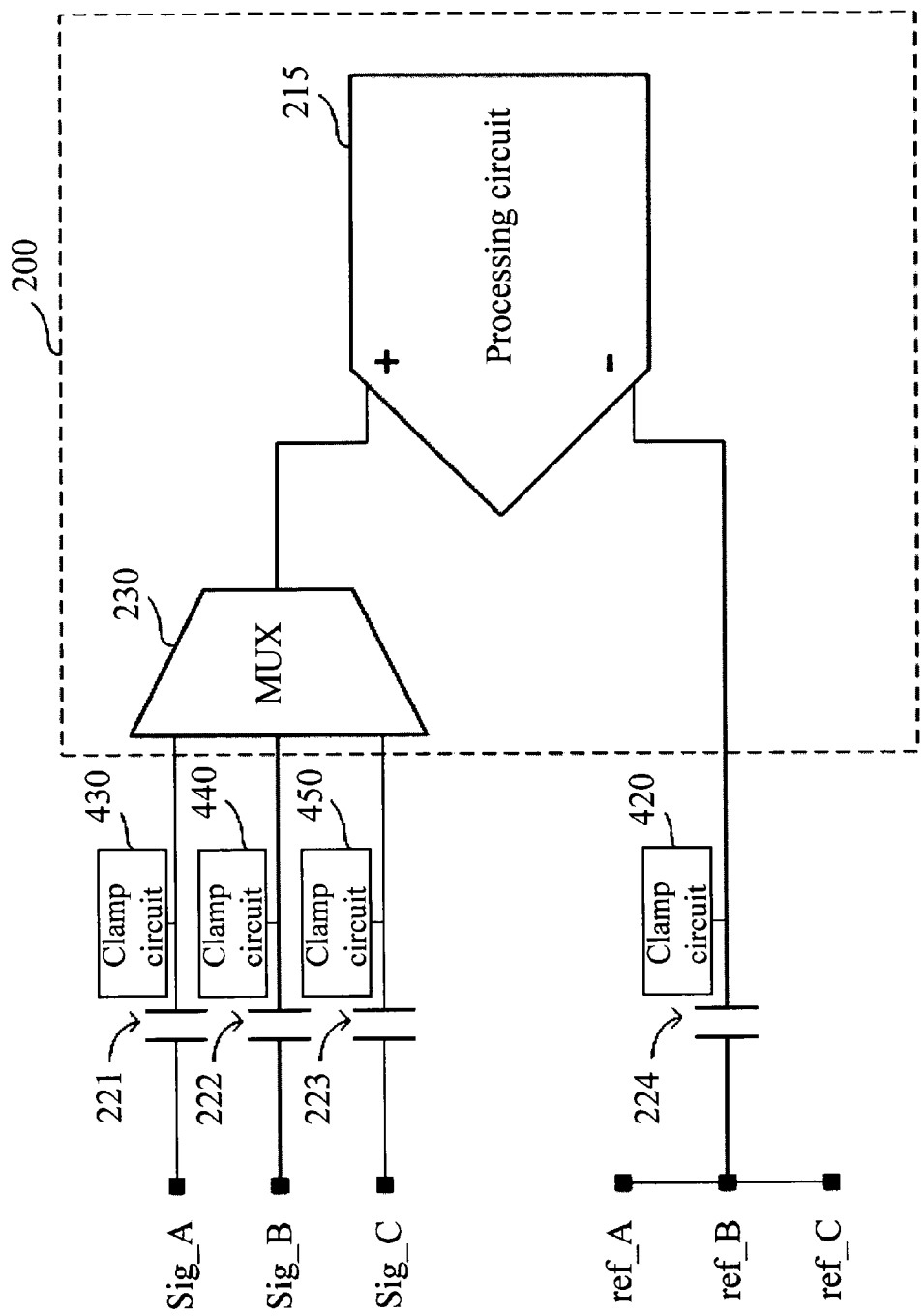
FIG. 6 is a schematic diagram of a coupling circuit according to a fifth embodiment of the invention.

Referring to FIG. 5, a schematic diagram of a coupling circuit according to a fourth embodiment of the invention is shown. The IC device 400 further includes clamp circuits 410 and 420, respectively coupled to the two input terminals of the processing circuit 215. The clamp circuit 410 is utilized for adjusting the dc voltage levels of the input signals sig_A, sig_B, and sig_C inside the IC device 400, and the clamp circuit 420 is utilized for adjusting dc voltage levels of the common reference signals ref_A, ref_B, and ref_C inside the IC device 400. The clamp circuits 410 and 420 can provide the same dc level or different dc levels according to the application of the processing circuit 215. There are many ways of implementing the clamp circuits 410 and 420. Generally, the clamp circuit can be a large resistor for coupling the input terminal of the processing circuit to a predetermined voltage level, or a timing controlled switch for coupling the input terminal to a predetermined voltage level within a suitable duration in order to adjust the dc level of the input terminal. In this embodiment, the devices with the same symbols as those depicted in the first embodiment have the same function and operation principle, but the processing circuit 215 does not include an extra clamp circuit. However, the input signals sig_A, sig_B, and sig_C can individually have their clamp circuits as shown in FIG. 6. The clamp circuits 430, 440 and 450 are respectively coupled to the coupling units 221, 222 and 223 for adjusting dc levels of the input signals sig_A, sig_B and sig_C. The clamp circuits 430, 440 and 450 can be disposed inside or outside the IC device and similarly, the clamp circuit 420 can be also disposed outside the IC device. FIG. 6 shows one of the possible embodiments only, but the scope of invention is not limited to this embodiment. Similarly, the devices with the same symbols as those depicted in the first embodiment have the same function and operation principle, but the processing circuit 215 does not include an extra clamp circuit.

Figure 7:
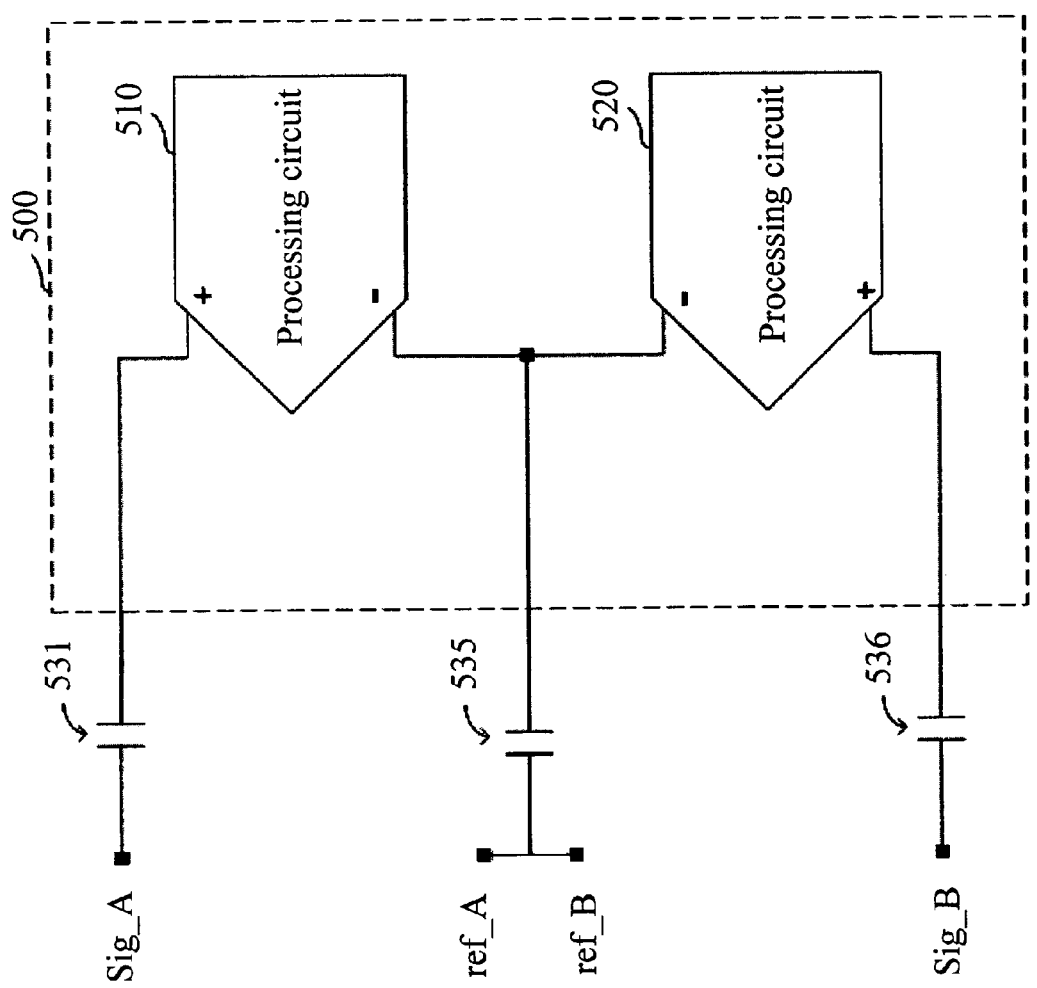
FIG. 7 is a schematic diagram of a coupling circuit according to a sixth embodiment of the invention.

Referring to FIG. 7, a schematic diagram of a coupling circuit according to the sixth embodiment of the invention is shown. The IC device 500 includes two processing circuits 510 and 520. The processing circuits 510 and 520 are independent to each other, that is, the operation of the processing circuit 510 does not affect the operation of the processing circuit 520. The input signal sig_A is transmitted to the IC device 500 via the coupling unit 531 and the signal sig_B is transmitted to the IC device 500 via the coupling unit 536. More specifically, the input signal sig_A is transmitted to one of the input terminals, such as a positive input terminal, of the processing circuit 510, and the input signal sig_B is transmitted to one of the input terminals, such as a positive input terminal, of the processing circuit 520. The reference signals ref_A and ref_B, which are respectively used by the processing circuits 510 and 520 for reference, are coupled to the IC device 500 through the same coupling unit 535. More specifically, the reference signal ref_A (or ref-B) is coupled to the other input terminal, such as a negative input terminal, of the processing circuit 510 (or 520). The reference signals ref_A and ref_B are respectively used by the input signals sig_A and sig_B as reference. Generally, most signals on a circuit board use the same reference point, such as the ground point, as their reference signals. Therefore, ordinarily, the reference signals ref_A and ref_B can be obtained from the same reference point, that is, the two signals ref_A and ref_B can form a common reference signal. The same as the first embodiment, the input signals sig_A and sig_B are generally analog signals and the processing circuits 510 and 520 are circuits for respectively processing the input signals sig_A and sig_B. For example, the processing circuit 510 or 520 can be a filter, an ADC, an amplifier, or a signal buffer. The processing circuits 510 and 520 use the common reference signals ref_A and ref_B received by the coupling unit 535 as reference. As mentioned above, if the reference signals ref_A and ref_B are referred to the same reference point, such as the ground point, the coupling unit 535 can receive just one of the two reference signals ref_A and ref_B, such as the reference signal ref_B, as a common reference signal, and couple the common reference signal ref_B to the processing circuits 510 and 520. Consequently, not only the two independent processing circuits 510 and 520 in the IC device 500 can use the same common reference signal to reduce the pin number of the IC device 500, but also the same coupling unit can be used for the reference signals on the circuit board to reduce the device number and thus the cost of the IC device 500. In this embodiment, the coupling units 531, 535 and 536 are implemented by capacitors, and the processing circuits 510 and 520 can optionally include clamp circuits for adjusting dc levels of the input signals sig_A, sig_B and the common reference signals ref_A, ref_B. Although only two processing circuits are illustrated in the embodiment, the IC device of the invention may include more than two processing circuits, which use a common coupling unit. It will not depart from the scope of the invention.

Figure 8:
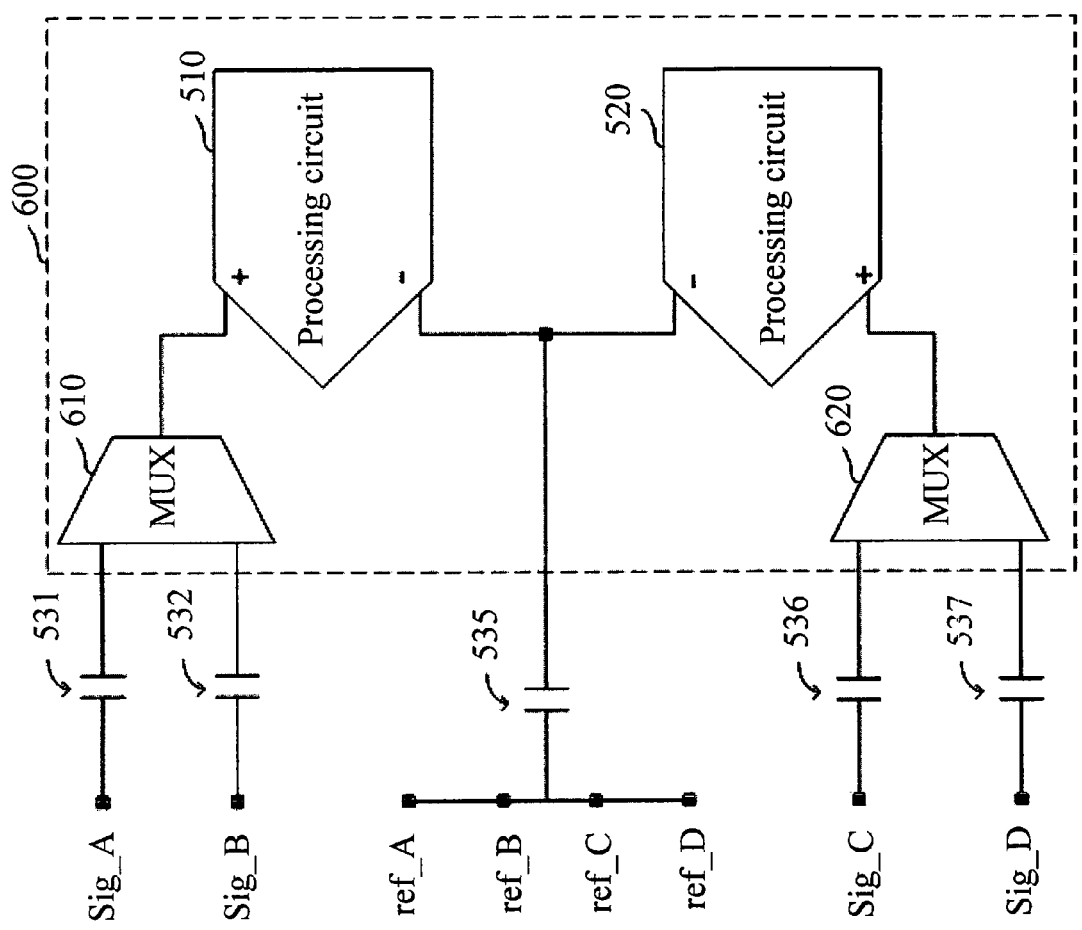
FIG. 8 is a schematic diagram of a coupling circuit according to a seventh embodiment of the invention.

Referring to FIG. 8, a schematic diagram of a coupling circuit according to a seventh embodiment of the invention is shown. The processing circuit 510 of the IC device 600 has an input terminal, such as a positive input terminal coupled to the coupling units 531 and 532 for receiving the input signals sig_A and sig_B via a multiplexer 610. The multiplexer 610 can selectively transmit the input signal sig_A or sig_B to the processing circuit 510 according to operation conditions of the processing circuit 510. Similarly, the processing circuit 520 has an input terminal, such as a positive input terminal, coupled to the coupling units 536 and 537 for receiving the input signals sig_C and sig_D via a multiplexer 620. The multiplexer 620 can selectively transmit the input signal sig_C or sig_D to the processing circuit 520 according to operation conditions of the processing circuit 520. Although one input terminal of the processing circuit 510 or 520 receives several signals, the other input terminal, such as a negative input terminal, of the processing circuit 510 or 520 can receive the reference signals ref_A, ref_B, ref_C and ref_D respectively corresponding to the input signals sig_A, sig_B, sig_C and sig_D commonly via the coupling unit 535. Generally, most signals on a circuit board use the same reference point, such as the ground point, for their reference signals. Therefore, ordinarily, the reference signals ref_A, ref_B, ref_C and ref_D can be obtained from the same reference point, that is, they can be a common reference signal. The same as the previous embodiment, the input signals sig_A, sig_B, sig_C and sig_D are generally analog signals, and the coupling units 531, 532, 535, 536 and 537 can be implemented by capacitors. In the embodiment, the IC device 600 can optionally include another multiplexer (not shown in the figure) coupled between the coupling units 535 and the processing circuits 510 and 520 such that the input impedance of the reference signals ref_A, ref_B, ref_C and ref_D can be closer to the input impedance of the input signals sig_A, sig_B, sig_C and sig_D. In the embodiment, the devices with the same symbols as those depicted in the fourth embodiment have the same function and operation principle.

Figure 9:
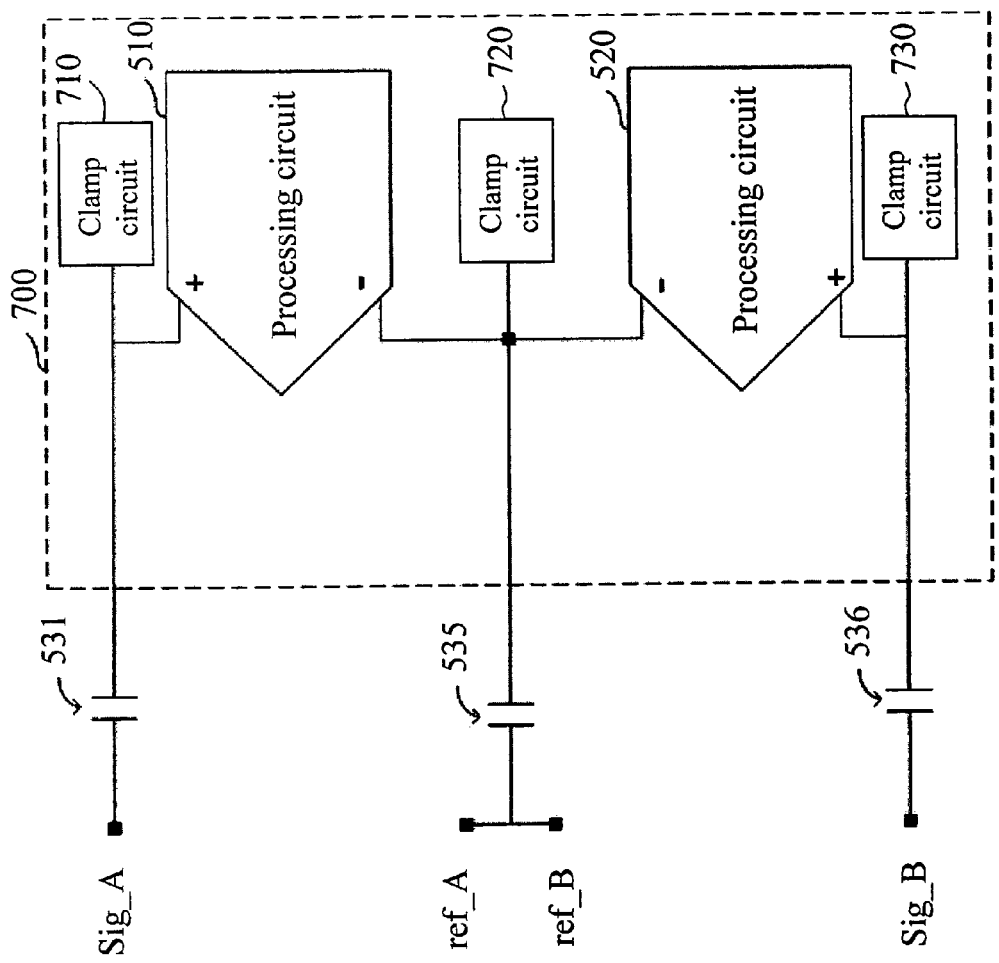
FIG. 9 a schematic diagram of a coupling circuit according to an eighth embodiment of the invention.

Referring to FIG. 9, a schematic diagram of a coupling circuit according to an eighth embodiment of the invention is shown. In the embodiment, in addition that the IC device 700 includes three clamp circuits 710, 720 and 730, the remaining circuits of the IC device 700 have the same operation principle as in the sixth embodiment. The clamp circuits 710, 720 and 730 in the IC device 700 are utilized for respectively adjusting dc levels of the input signal sig_A, the input signal sig_B, and the common reference signals ref_A and ref_B. Similarly, the clamp circuits 710, 720 and 730 can provide the same dc level or different dc levels according to the application conditions of the processing circuits 510 and 520. There are many ways of implementing the clamp circuits 720 and 730. Ordinarily, the clamp circuit can be a large resistor for coupling the input terminal of the processing circuit to a predetermined voltage level, or a timing controlled switch for coupling the input terminal to a predetermined voltage level within a suitable duration in order to adjust a dc level of the input terminal. The same as the fifth embodiment, the clamp circuits 710, 720 and 730 can be disposed outside the IC device 700.

As mentioned above, in various signal coupling circuits, compared to the prior art which couples each reference signal to an individual pin of the IC device via an individual coupling unit, the invention utilizes a single coupling unit to couple the common reference signal corresponding to a number of input signals to the same pin of the IC device. Therefore, the number of pins of the IC device and the coupling units can be reduced to achieve the purpose of reducing device size and cost.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A signal coupling circuit, for coupling an analog input signal to a processing circuit, comprising:
    a plurality of first coupling units, coupled to a first input terminal of the processing circuit, for respectively receiving a plurality of input signals;
    a first multiplexer (MUX), coupled between the first coupling units and the processing circuit, for selecting one of the input signals and transmitting the selected input signal to the processing circuit; and
    a second coupling unit, coupled to a second input terminal of the processing circuit, for receiving a common reference signal, wherein the processing circuit receives the common reference signal via the second coupling unit and uses the common reference signal as reference for processing some or all of the input signals.

2. The signal coupling circuit according to claim 1, wherein the first coupling units are implemented by capacitors.

3. The signal coupling circuit according to claim 1, wherein the second coupling unit is implemented by a capacitor.

4. The signal coupling circuit according to claim 1, further comprising:
    a second multiplexer (MUX), coupled between the second coupling unit and the processing circuit.

5. The signal coupling circuit according to claim 1, wherein the processing circuit is an analog-to-digital converter (ADC).

6. The signal coupling circuit according to claim 1, further comprising:
    at least a clamp circuit, coupled to the first input terminal of the processing circuit, for adjusting dc voltage levels of the input signals.

7. The signal coupling circuit according to claim 1, further comprising:
    a clamp circuit, coupled to the second input terminal of the processing circuit, for adjusting a dc voltage level of the common reference signal.

8. A method for coupling an analog input signal to a processing circuit, comprising:
    utilizing a plurality of first coupling units to respectively receive different input signals;
    coupling the input signals to a first input terminal of the processing circuit;
    utilizing a second coupling unit to receive a reference signal; and
    coupling the reference signal to a second input terminal of the processing circuit, wherein the processing circuit receives the reference signal via the second coupling unit and uses the reference signal as reference for processing some or all of the input signals.

9. The method according to claim 8, further comprising: selecting one of the input signals and transmitting the selected input signal to the processing circuit.

10. The method according to claim 8, wherein the processing circuit is an analog-to-digital converter (ADC).

11. The method according to claim 8, further comprising adjusting dc voltage levels of the input signals before the processing circuit processes the input signals.

12. The method according to claim 8, further comprising adjusting a dc voltage level of the reference signal before the processing circuit receives the reference signal.

* * * * *

UNITED STATES PATENT AND TRADEMARK OFFICE
CERTIFICATE OF CORRECTION

| | | |
|---|---|---|
| PATENT NO. | : 7,586,359 B2 | Page 1 of 1 |
| APPLICATION NO. | : 11/493515 | |
| DATED | : September 8, 2009 | |
| INVENTOR(S) | : Chien-Hung Chen | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 196 days.

Signed and Sealed this

Fourteenth Day of December, 2010

David J. Kappos
*Director of the United States Patent and Trademark Office*